United States Patent
Chen et al.

[11] Patent Number: 6,136,164
[45] Date of Patent: Oct. 24, 2000

[54] APPARATUS FOR DETECTING POSITION OF COLLIMATOR IN SPUTTERING PROCESSING CHAMBER

[75] Inventors: Ing-Tang Chen, Taipei; Horng-Bor Lu, Hsinchu, both of Taiwan

[73] Assignee: United Microelectronics Corp., Hsinchu, Taiwan

[21] Appl. No.: 09/115,743

[22] Filed: Jul. 15, 1998

[51] Int. Cl.[7] .................................................. C23C 14/34
[52] U.S. Cl. ............................. 204/298.03; 204/298.11; 204/298.32; 250/328.1
[58] Field of Search .................. 204/298.03, 298.11, 204/298.32; 250/338.1

[56] References Cited

U.S. PATENT DOCUMENTS

| | | | |
|---|---|---|---|
| 5,630,917 | 5/1997 | Guo | 204/192.12 |
| 5,635,036 | 6/1997 | Demaray et al. | 204/192.12 |

FOREIGN PATENT DOCUMENTS

| | | | |
|---|---|---|---|
| 634779 | 1/1995 | European Pat. Off. | H01J 37/34 |

*Primary Examiner*—Nam Nguyen
*Assistant Examiner*—Steven H. VerSteeg

[57] ABSTRACT

An apparatus for detecting the position of a collimator in a sputter-processing chamber is disclosed in the present invention. A target holder is at the upper portion of the chamber and a target is attached to the bottom surface of the target holder. A substrate holder is at the underlying portion of the chamber and it is opposed to the target holder. A silicon wafer is putted on the substrate holder. Two supporters are on an inner surface of the housing of the chamber and are separated to oppose to each other, the supporters protrude the housing. A collimator is putted on the supporters and it is parallel to the surface of the target. Two sensors is attached on the under surface or the lateral surface of the supporters. The horizontal height of the sensors is lower than that of the collimator. When the collimator is heated and it distorts, the position of the collimator will change to enter into the available area of the sensors. Afterwards, an alarm will announce a notice to supervisors of the sputtering system.

3 Claims, 4 Drawing Sheets

APPARATUS FOR DETECTING POSITION OF COLLIMATOR IN SPUTTERING PROCESSING CHAMBER

FIELD OF THE INVENTION

The present invention relates to an apparatus of a sputter processing chamber, and more specifically, to an apparatus for detecting the position of a collimator of a sputtering processing chamber.

BACKGROUND OF THE INVENTION

The fabrication of a semiconductor device conventionally uses a sputtering system to form a metal layer on a substrate. A silicon wafer is positioned in opposition to a target of a required film forming material in a processing vessel. The sputtering processing vessel has an inlet and an outlet. Processing gas is introduced into the vessel from the inlet and a vacuum pump is connected with the outlet to attract the processing gas in the vessel. The interior of the processing vessel is maintained at a required low-pressure atmosphere, whereby particles sputtered from the target are applied to the objects.

The metal target is placed on a target holder and the silicon wafer is on a substrate holder. Direct-current power supply is applied to the target holder and the substrate holder, and the processing gas is ionized to form plasma between the target and the silicon wafer. In order to allow the positive ions of the plasma to collide with the surface of the target, the cathode of a power supply is connected to the target holder.

With recent developments in high-density integration of semiconductor devices, techniques for filling in submicron vias must be developed. However, known sputtering processes exhibit low step coverage characteristics. As contact holes of integrated circuits have a large aspect ratio, wiring discontinuities tend to occur at the bottom of the holes. In high-integration integrated circuit, the problem of incomplete-filling of the contact holes often occurs.

A sputtering processing apparatus with a collimator is used to enhance the step coverage of sputtering processes. By using the collimator, the metal sputtering process may be applied to the fabrication of 0.35-micron integrated circuits, even that of 0.25-micron integrated circuits.

Referring to FIG. 1, a schematic cross sectional view of a sputtering processing vessel 100 is shown. A target holder 145 is at the upper inner portion of the sputtering processing vessel 100 and a target 150 is attached to the bottom surface of the target holder. In general, the direct-current sputtering process is used for a deposition of metal or barrier material and the target 150 consists of that material.

A substrate holder 140 is placed at the lower inner portion of the sputtering processing vessel 100 and a silicon wafer 160 is placed on the top surface of the substrate holder. During the sputtering process, ionized gas collides with the bottom surface of the target 150 and metal ions are deposited on the top surface of the silicon wafer 160. Thus, the target 150 must be connected to the cathode of a direct-current power supply and the substrate holder 140 for supporting the silicon wafer 160 should be connected to the anode of the direct-current power supply or to ground.

The sputtering processing vessel 100 has an inlet 109 and an outlet 110. Processing gas for the sputtering process is introduced into the sputtering processing vessel 100 from the inlet 109. A vacuum pump connects with the outlet 100 for attracting the processing gas in the sputtering processing vessel 100. The processing gas typically comprises argon (Ar) and nitrogen (N$_2$).

The metal atoms, which are bombarded by ionized gas, leave the surface of the target 150 at a large angle and a small angle, with respect to the direction perpendicular to the surface of the target 150. The metal atoms cannot be perpendicularly deposited on the silicon wafer 160 and the step coverage for the contact holes in the silicon wafer 160 is poor. By using the metal sputtering process, incomplete fillings often form in high aspect-ratio contact holes and the contact resistance of the contact hole will significantly increase.

A collimator 170 is placed between the silicon wafer 160 and the target 150, as demonstrated in FIG. 2, to improve the step coverage of the sputtering process. A pair of supporters 165 are positioned on the inner surface of the sputtering processing vessel 100 between the target 150 and the silicon wafer 160. The supporters 165 protrude from the surface of the sputtering processing vessel 100 to form two protrusions. The supporters 165 are opposed to each other and the collimator 170 is placed on the pair of supporters. Referring to FIG. 3, a top view of the portion of the collimator 170 according to FIG. 2 is demonstrated. The collimator 170 consists of a plurality of through-holes 10.

The step coverage of the sputtering process is improved by using the sputtering apparatus with the collimator 170. As target atoms leave the surface of the target 150 at a large inclined angle with respect to a direction perpendicular to the surface of the target 150, these atoms will contact the sidewalls of the through-holes 10 and not contact the silicon wafer 160. Consequently, only the small-angle target atoms contact the surface of the silicon wafer 160 and the step coverage of the contact holes is enhanced.

The function of the collimator 170 depends on the geometry-design. In general, the aspect ratio of the through-hole 10 is about 1:1 or 1.5:1. A step-coverage ability of a sputtering process by using a collimator with an aspect-ratio about 2:1 is enhanced by 10% to 25% as compared to a conventional sputtering process.

The silicon wafer 160 must be heated during the sputtering process an the collimator 170 is also heated. The collimator 170 consists of plural through-holes 10 and it is made of stainless steel. When the collimator 170 is kept at a high temperature, it will be distorted and become curved, as illustrated in FIG. 4. Thus, the surface of the collimator 170 cannot remain parallel to the surface of the target 150 and the collimator 170 will not stop the target atoms with a large-angle sputtering That is, a sputtering processing using a distorted collimator does not have good step-coverage ability. If the collimator 170 distorts excessively, the supporters 165 cannot support it and the collimator falls to the silicon wafer 160, as shown in FIG. 5.

Replacing the distorted collimator with a new apparatus could solve the above problem as mentioned in FIGS. 4 and 5. However, production line supervisors find it difficult to locate distorted collimator until the products on the silicon wafer have low yields or the collimator falls to the silicon wafer, resulting in production line loss in a factory. Therefore, an apparatus for detecting the distortion of the collimator or the variation of the position of the collimator is required for improving the sputter processing equipment.

SUMMARY OF THE INVENTION

The present invention discloses an apparatus for detecting the position of the collimator. A target holder is in the sputtering processing vessel and a target is attached on a bottom surface of the target holder. A substrate holder is in the sputtering processing vessel to oppose to the target holder and a substrate is placed on the top surface of the substrate holder. A pair of supporters are attached on an inner surface of the sputtering processing vessel between the target holder and the substrate holder. The supporters protrude from the inner surface of the sputtering processing vessel and are opposed to each other. The collimator is placed on the pair of supports. A sensor is attached on the bottom surface or the lateral surface of each of the pair of supports. When the horizontal height of the collimator is changed, the sensors will send out a warning.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses an apparatus for detecting the variation of the position of the collimator in a sputtering processing vessel. When the collimator is heated up and distorts, sensors detect the position of the collimator and an alarm sends a notice to supervisors of the sputter processing equipment. When the supervisors know that the collimator is distorted, a new collimator is replaced for the distorted collimator. The apparatus for detecting the position of the collimator is attached on the under surface or the lateral surface of the supporters which support the collimator. The apparatus is an infrared sensor or an electrical device. After the collimator distorts and changes its position, its horizontal height is lower than that of the sensors. The sensors will detect the collimator and an alarm will trigger.

Figure 6:
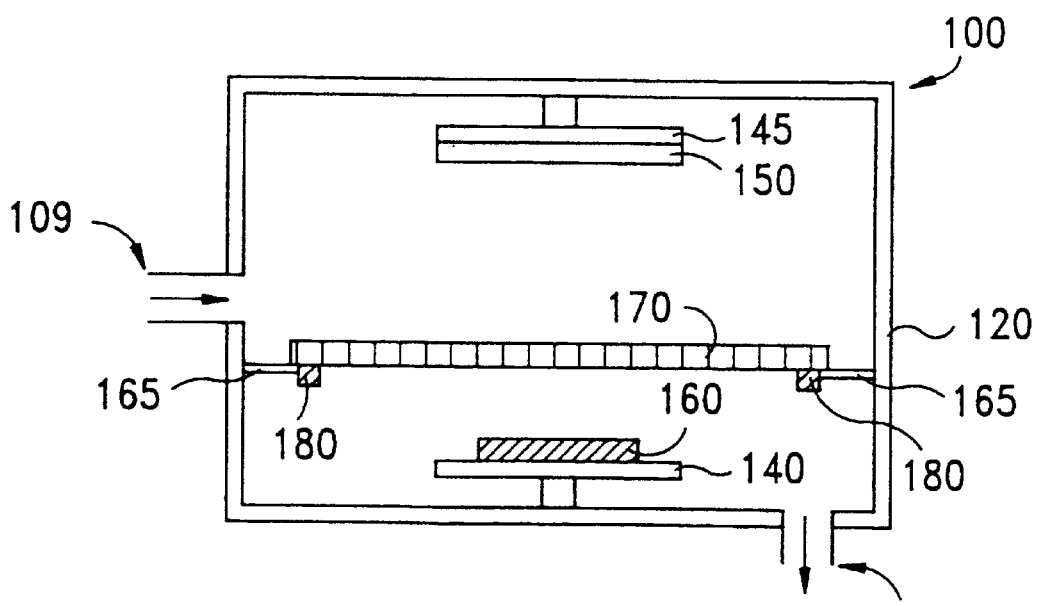
FIG. 6 is a schematic cross sectional view of the sputtering processing vessel according to the present invention, with sensors on the lateral surface of the supporters of the collimator to detect the position of the collimator.

Referring to FIG. 6, a schematic cross sectional view of a sputtering processing vessel 100 is shown. The sputtering processing vessel 100 has housing 120 with an inlet 109 and an outlet 110 which are on the left-upper side and the right-bottom side of the housing 120, respectively. Processing gas is introduced into the sputtering processing vessel 100 from the inlet 109 and a vacuum pump is connected with the outlet 110 to attract the processing gas in the sputtering processing vessel 100. During the sputtering process, the sputtering processing vessel 100 is maintained at a low pressure.

Before the sputtering process starts, gas in the sputtering processing vessel 100 must be attracted and the sputtering processing vessel 100 is maintained at a low-pressure before $10^{-6}$ to $10^{-7}$ Torr. The processing gas is then introduced into the sputtering processing vessel 100 and the sputtering of metal material starts. The processing gas is typically a mixture gas of argon and nitrogen.

Still referring to FIG. 6, a target holder 145 is at the upper portion of the sputtering processing vessel 100. A target 150 is attached to the under surface of the target holder 145 and it is made of a material which will be deposited on the silicon wafer 160. A substrate holder 145 is at the lower portion of the sputtering processing vessel 100 and is opposed to the target holder 145. A silicon wafer 160 is placed on the top surface of the substrate holder 140.

Figure 1:
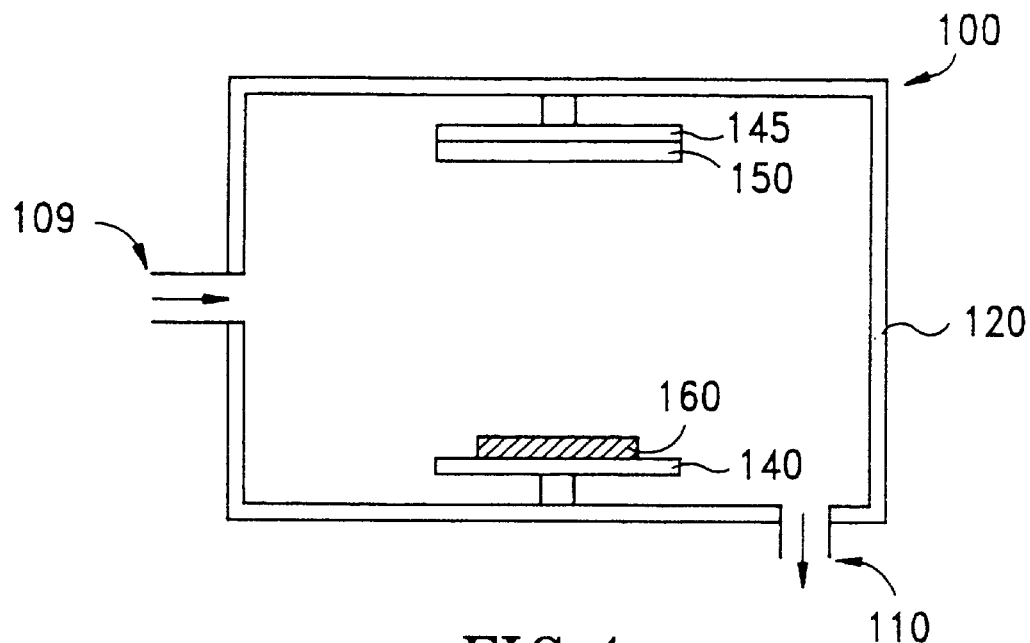
FIG. 1 is a schematic cross sectional view of a sputtering processing vessel according to prior art, wherein a target holder is at the upper portion of the sputtering processing vessel and a silicon wafer is placed on a substrate holder.
Figure 2:
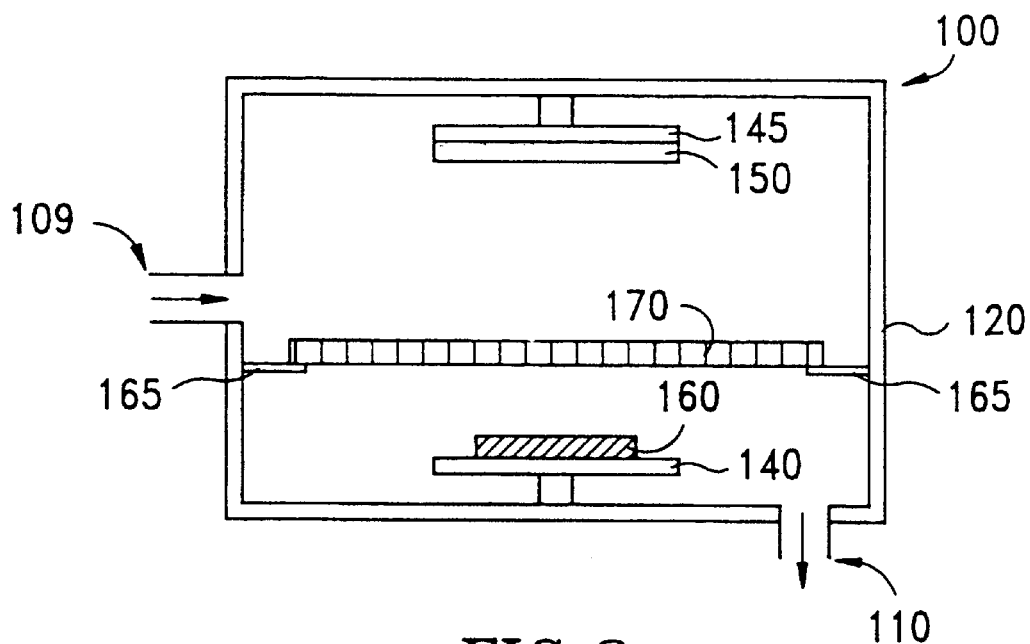
FIG. 2 is a schematic cross sectional view of the sputtering processing vessel according to prior art, wherein a pair of supporters are on the inner surface of the vessel between the substrate holder and the target holder, and a collimator is supported by the pair of supporters.
Figure 3:
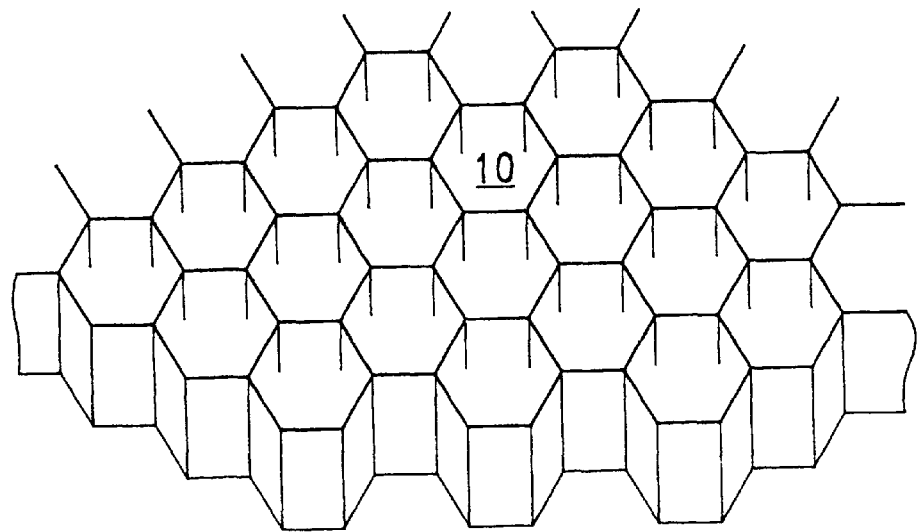
FIG. 3 is a top view of the collimator according to prior art, the collimator consisting of a plurality of through-holes.
Figure 4:
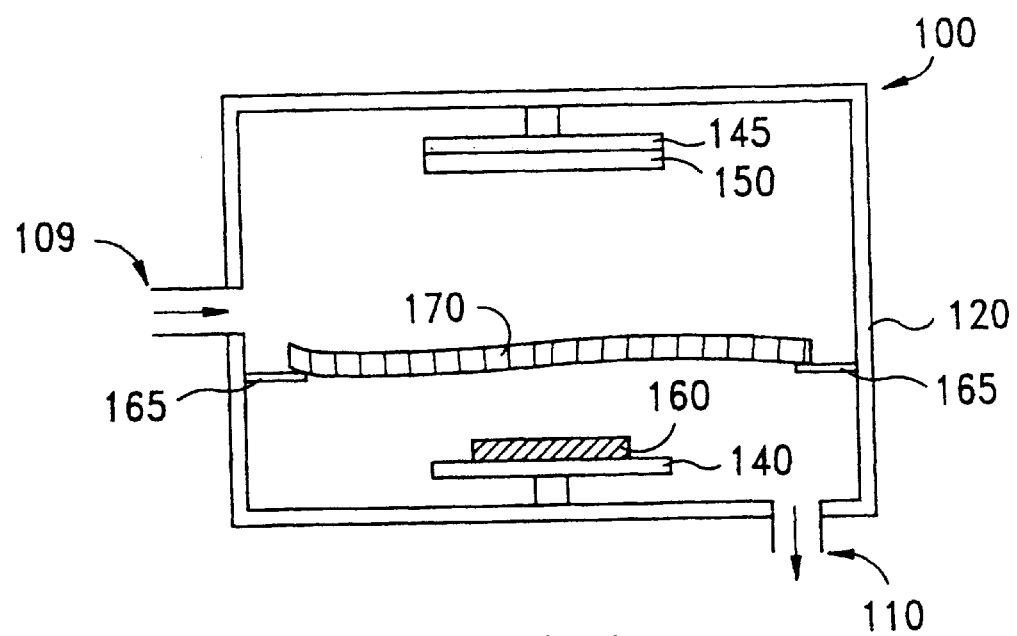
FIG. 4 shows that the collimator distorts with heat during the sputtering process.
Figure 5:
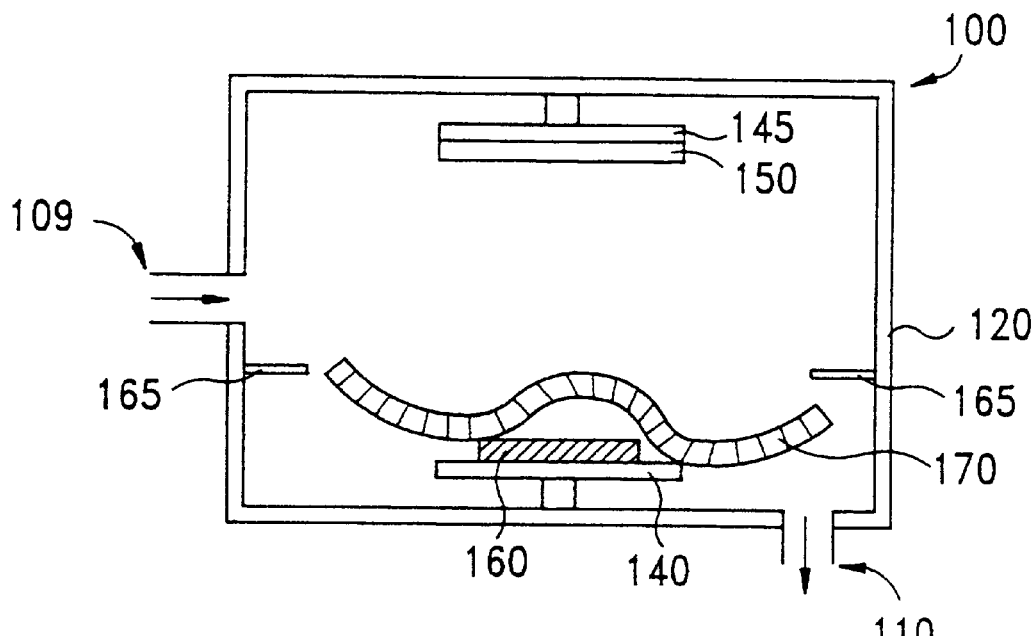
FIG. 5 shows that the collimator falls to the silicon wafer and the devices of the silicon wafer are destroyed.

Referring to FIG. 6, two supporters 165 are positioned at the inner surface of the housing 120 between the target holder 145 and the substrate holder 140. The supporters 165 protrude from the housing 120 and are separated and opposed to each other. The collimator 170 is placed on the supporters 165 and is parallel to the target 150 and the silicon wafer 160. The collimator 170 includes through-holes 10, as shown in FIG. 3, and the aspect ratio of the through-holes 10 is typically 1:1 and 1.5:1.

In the sputtering processing vessel 100, in order to let positive ions bombard the surface of the target 150, the target holder 145 is coupled to the cathode of a direct-current power supply the substrate holder 140 is coupled to the anode of the DC power supply. During the sputtering process, the silicon substrate 160 is heated and the collimator 170 is also heated.

Referring to FIG. 6, two sensors 180 are attached on the lateral surfaces of the supporters 165 and the height of the sensors 180 is lower than the collimator 165. The sensors 180 are infrared detector or electrical devices. When the collimator 170 is distorted due to heat, the height of the collimator 170 is lower than that of the sensors 180. The sensors 180 will send an alarm notice to supervisors of the sputtering systems.

Figure 7:
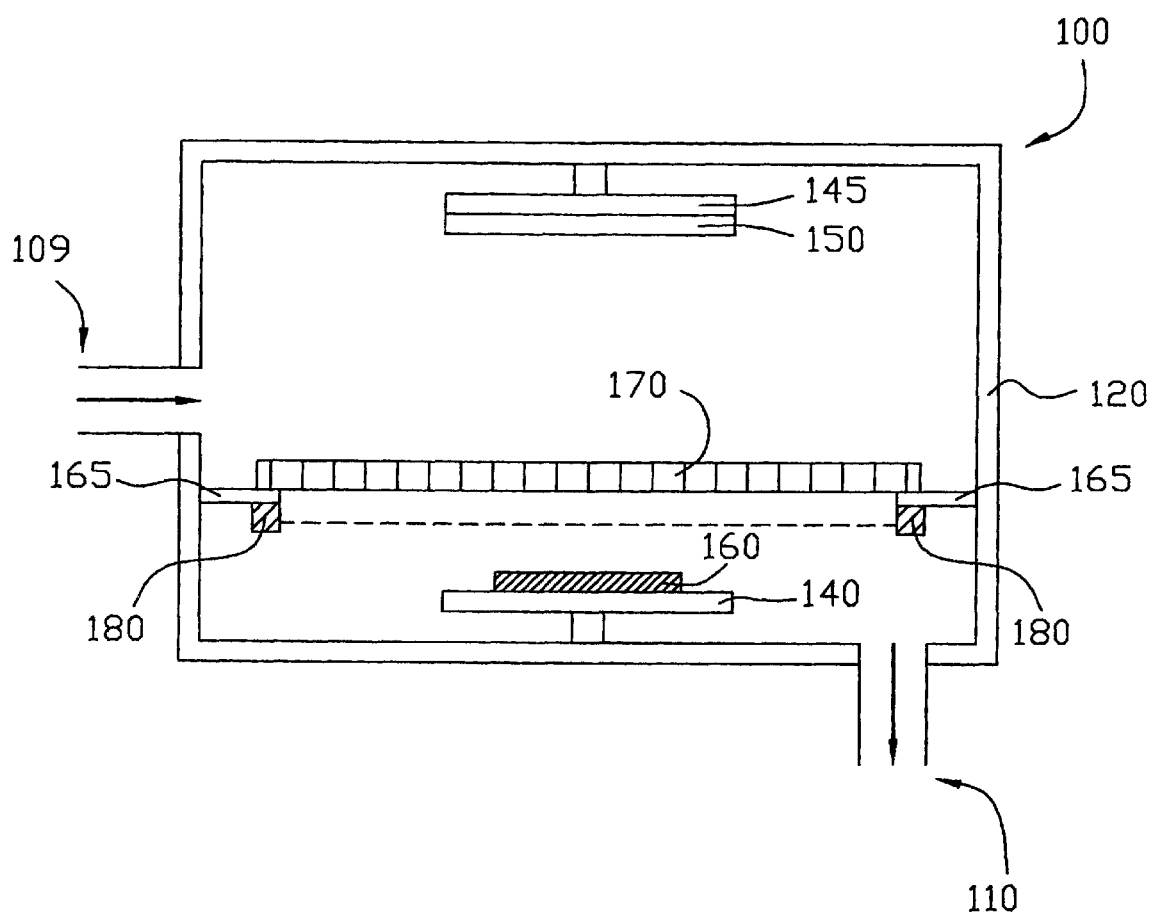
FIG. 7 is a schematic cross sectional view of the sputtering processing vessel according to the present invention, wherein a pair of sensors are under the supporters to detect the position of the collimator.

Referring to FIG. 7, a schematic cross sectional view of sputtering processing vessel 100 is shown. The arrangement of the target 150, the substrate holder 140, the supporters 170 and the collimator 170 is similar to the arrangement that is shown in FIG. 6. In this embodiment, the sensors 180 are placed under the supporters 165 and the height of the sensors 180 is equal to that of the supporters 165.

The sensor 180 that is used in this FIG. 6 embodiment is closer to the collimator 170 than that in the FIG. 7 embodiment. When the position of the collimator 170 slightly varies, the sensor 180 easily detects the change of the position of the collimator.

While the preferred embodiment of the invention has been illustrated and described, it will be appreciated that various changes can be made therein without departing from the spirit and scope of the invention.

What is claimed is:

1. An apparatus for detecting a position of a collimator of a sputtering processing vessel, comprising:

a target holder positioned in said sputtering processing vessel, said target holder having a target attached to a bottom surface thereof;

a substrate holder positioned in said sputtering processing vessel to oppose said target holder, wherein a substrate is put on a top surface of said substrate holder;

a pair of supporters on an inner surface of said sputtering processing vessel between said target holder and said substrate holder, protruding from an inner surface of said sputtering processing vessel and opposed to each other, wherein a collimator is put on said supporters; and a sensor attached to the bottom surface of each of said supporters, whereby as a horizontal height of said collimator is lower than a horizontal height of said sensor, said sensor sending out an alarm indicating said horizontal height of said collimator has changed.

2. The apparatus of claim 1, wherein said collimator comprises a plurality of circular through-holes.

3. The apparatus of claim 1, wherein said sensor comprises an infrared sensor.

* * * * *